United States Patent
Lee (10) Patent No.: US 11,469,047 B2
(45) Date of Patent: Oct. 11, 2022

(54) METHOD FOR MANUFACTURING HIGH-PROFILE AND HIGH-CAPACITANCE CAPACITOR

(71) Applicant: XIA TAI XIN SEMICONDUCTOR (QING DAO) LTD., Qingdao (CN)

(72) Inventor: Sang-Man Lee, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 369 days.

(21) Appl. No.: 16/810,985

(22) Filed: Mar. 6, 2020

(65) Prior Publication Data
US 2021/0280372 A1 Sep. 9, 2021

(51) Int. Cl.
| | |
|---|---|
| H01G 4/224 | (2006.01) |
| H01G 4/14 | (2006.01) |
| H01G 13/06 | (2006.01) |
| H01G 4/008 | (2006.01) |
| H01L 27/108 | (2006.01) |
| H01L 27/10 | (2006.01) |
| H01G 4/33 | (2006.01) |

(52) U.S. Cl.
CPC ............ *H01G 4/224* (2013.01); *H01G 4/008* (2013.01); *H01G 4/14* (2013.01); *H01G 4/33* (2013.01); *H01G 13/06* (2013.01); *H01L 27/101* (2013.01); *H01L 27/10861* (2013.01)

(58) Field of Classification Search
CPC .......... H01G 4/008; H01G 4/012; H01G 4/14; H01G 4/224; H01G 4/33; H01G 13/06; H01L 27/101; H01L 27/1085; H01L 27/10861; H01L 28/90

See application file for complete search history.

(56) References Cited

U.S. PATENT DOCUMENTS

| | | | |
|---|---|---|---|
| 9,142,610 B2* | 9/2015 | Kim | H01L 28/87 |
| 9,177,960 B2* | 11/2015 | Seo | H01L 27/10876 |
| 9,240,441 B2* | 1/2016 | Yoon | H01L 28/91 |
| 9,659,940 B2* | 5/2017 | Park | H01L 27/10852 |
| 9,917,147 B2* | 3/2018 | Lee | H01L 28/90 |
| 10,475,661 B2* | 11/2019 | Seo | H01L 21/02057 |
| 2010/0240191 A1 | 9/2010 | Chung et al. | |
| 2012/0064680 A1* | 3/2012 | Oh | H01G 13/06 |
| | | | 257/E21.409 |
| 2015/0364366 A1 | 12/2015 | Kim et al. | |

* cited by examiner

*Primary Examiner* — Nathan Milakovich
(74) *Attorney, Agent, or Firm* — ScienBiziP, P.C.

(57) ABSTRACT

A method for manufacturing a high-profile capacitor with high capacity includes providing a substrate, forming a first mold layer, a first supporter layer, a second mold layer, and a second supporter layer on the substrate, where at least one of the first mold layer and the second mold layer are made of a dielectric material having a low or super low dielectric constant, defining at least one contact hole, where the now-surrounding first and second supporter layers reinforce the at least one contact hole and form first and second supporter patterns respectively, forming a lower electrode on an inner surface of the at least one contact hole, and removing the first mold layer and/or the second mold layer being made of the dielectric material by ashing.

16 Claims, 8 Drawing Sheets

METHOD FOR MANUFACTURING HIGH-PROFILE AND HIGH-CAPACITANCE CAPACITOR

FIELD

The subject matter herein generally relates to a method for manufacturing a capacitor.

BACKGROUND

As semiconductor devices become highly integrated, the size of a semiconductor device parallel to a semiconductor substrate become smaller. However, a small size may result in small capacitance for storing charges. Thus, in order to maintain the semiconductor device (for example, a capacitor) with sufficient capacitance, a height of a lower electrode of the capacitor needs to be increased.

However, a large aspect ratio of the lower electrode may cause the lower electrode to easily collapse, thereby increasing the difficulty of the process.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 1:
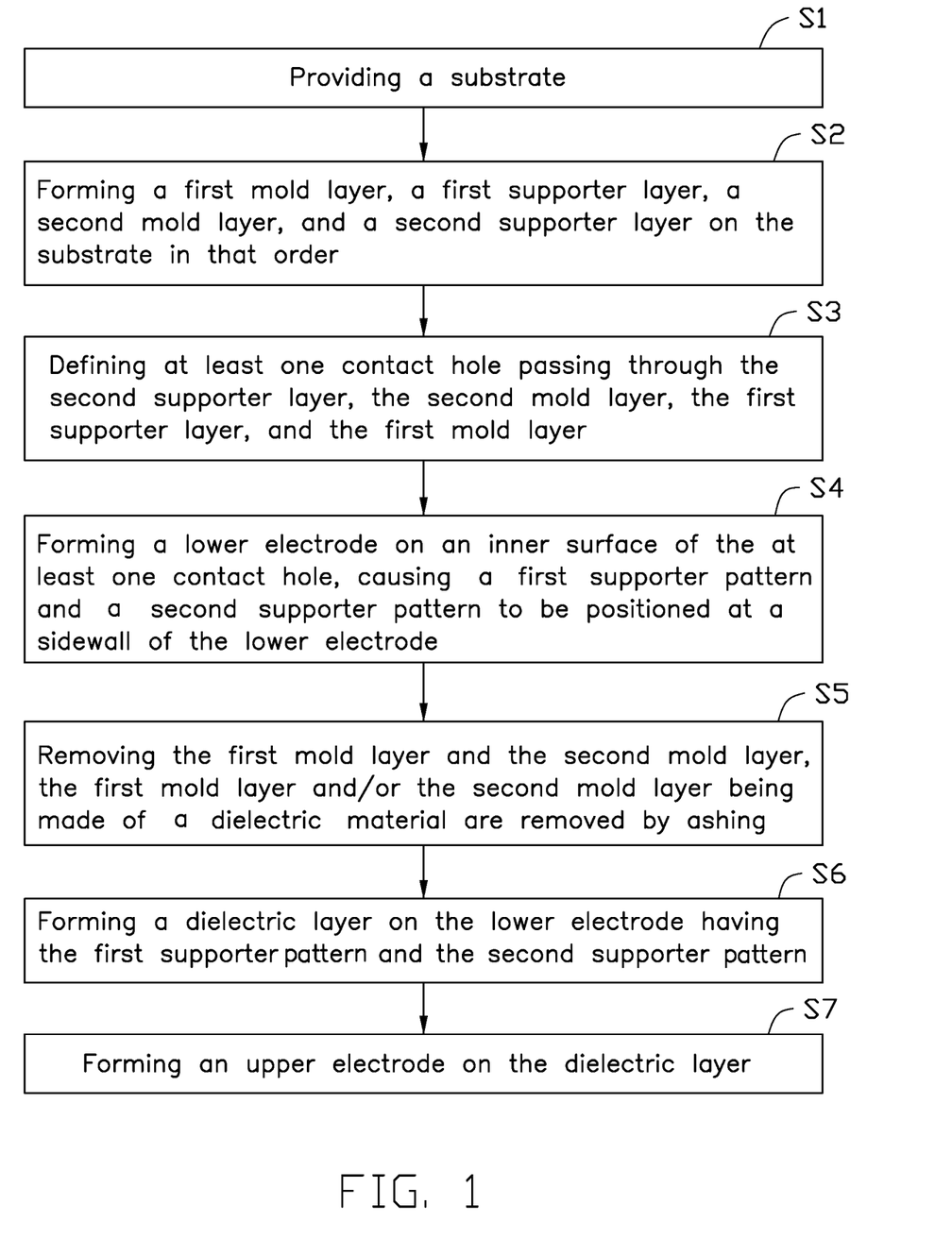
FIG. 1 is a flowchart of an embodiment of a method for manufacturing a capacitor according to the present disclosure.

Referring to FIG. 1, a method for manufacturing a capacitor is presented in accordance with an embodiment. The method is provided by way of example, as there are a variety of ways to carry out the method. The method may begin at step S1.

Figure 2:
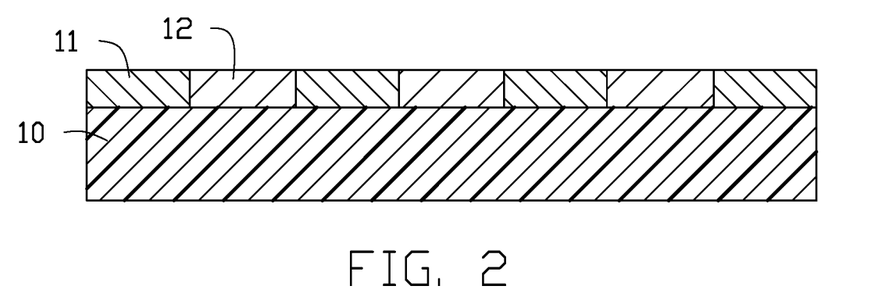
FIG. 2 is a schematic view of a substrate used in the method of FIG. 1.

At step S1, referring to FIG. 2, a substrate 10 is provided.

The substrate 10 can be made of an undoped single crystal silicon, a doped single crystal silicon, or a silicon on insulator (SOI).

In the embodiment, an insulating layer 11 is formed on the substrate 10. At least one contact plug 12 is formed in the insulating layer 11, which penetrates the insulating layer 11. The at least one contact plug 12 is in contact with at least one doped region (not labeled) in the substrate 10.

Figure 3:
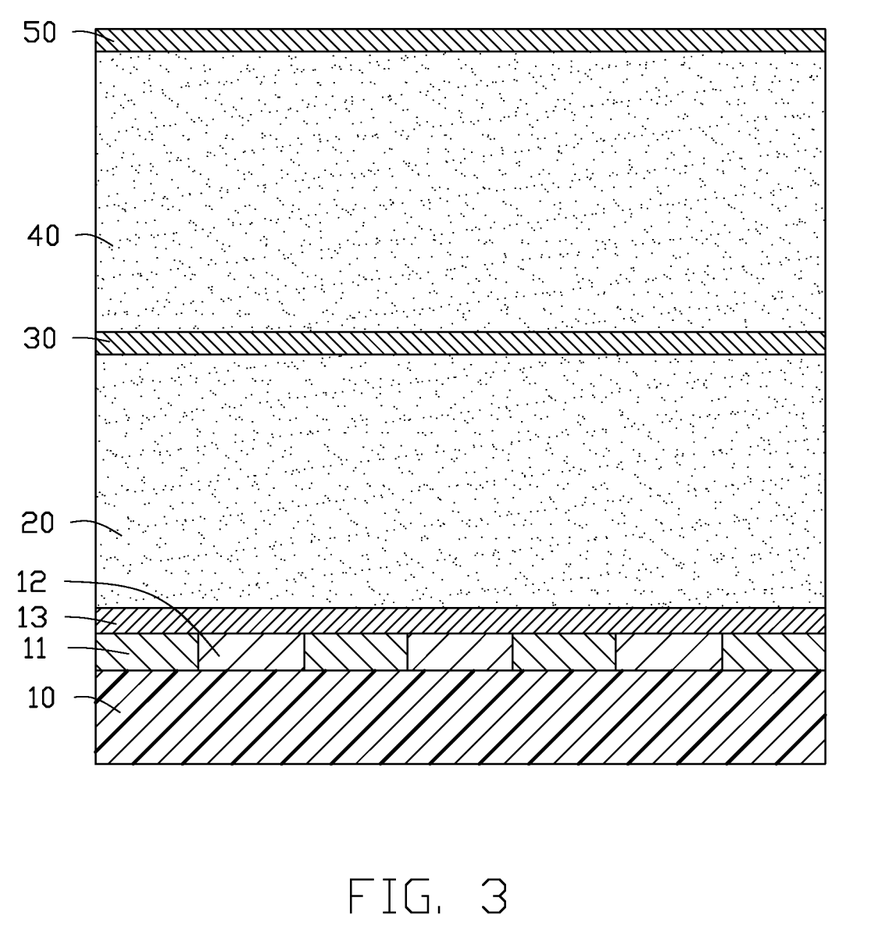
FIG. 3 is a schematic view showing a first mold layer, a first supporter layer, a second mold layer, and a second supporter layer on the substrate of FIG. 2.

At step S2, referring to FIG. 3, a first mold layer 20, a first supporter layer 30, a second mold layer 40, and a second supporter layer 50 are formed on the substrate 10 in this order. At least one of the first mold layer 20 and the second mold layer 40 is made of a dielectric material having a low dielectric constant or a super low dielectric constant.

In the embodiment, an etched stop layer 13 is further formed on the insulating layer 11. The first mold layer 20 is formed on the etched stop layer 13. The etched stop layer 13 may be made of silicon nitride.

In the embodiment, the dielectric material is porous. The dielectric constant is in a range of 2.0 to 3.0. For example, the dielectric material is a polymer of atom transfer radical polymerization (ATRP) or octamethylcyclotetrasiloxane (OMCTS).

In the embodiment, the first mold layer 20 is made of boro-phospho-silicate glass (BPSG), fluorosilicate glass (FSG), phosphosilicate glass (PSG), and any combination thereof, and the second mold layer 40 is made of the dielectric material.

In another embodiment, the first mold layer 20 is made of the dielectric material, and the second mold layer 40 is made of silica.

In yet another embodiment, both the first mold layer 20 and the second mold layer 40 are made of the dielectric material.

The first supporter layer 30 and the second supporter layer 50 may be made of silicon nitride.

Figure 4:
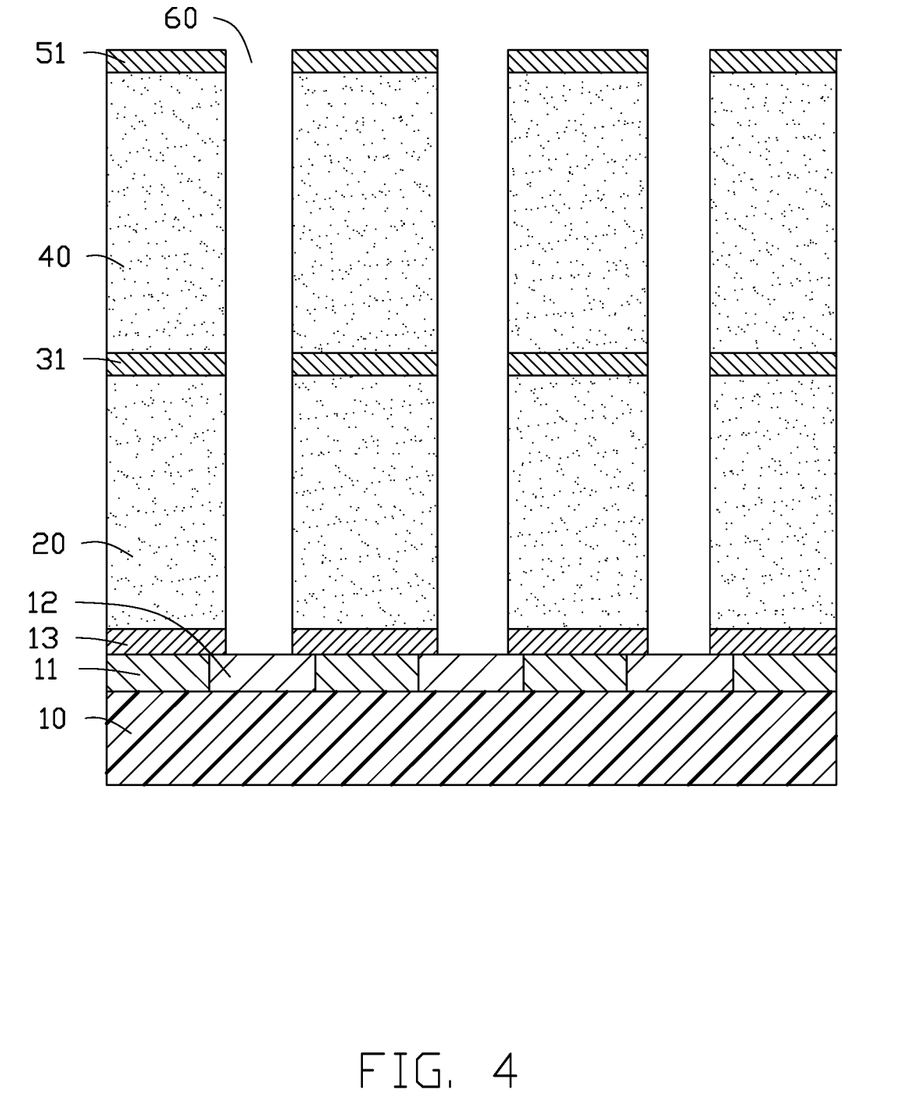
FIG. 4 is a schematic view showing a contact hole passing through the second supporter layer, the second mold layer, the first supporter layer, and the first mold layer according to the method of FIG. 3, to form a first supporter pattern and a second supporter pattern.

At step S3, referring to FIG. 4, at least one contact hole 60 is defined, which passes through the second supporter layer 50, the second mold layer 40, the first supporter layer 30, and the first mold layer 20. The first supporter layer 30 and the second supporter layer 50 having the at least one contact hole 60 form a first supporter pattern 31 and a second supporter pattern 51, respectively.

In the embodiment, when the etched stop layer 13 is further formed on the insulating layer 11, the at least one contact hole 60 also penetrates the etched stop layer 13. The at least one contact plug 12 is exposed from the at least one contact hole 60.

A height of each of the first supporter pattern 31 and the second supporter pattern 51 may be set according to a thickness of each of the first mold layer 20 and the second mold layer 40, respectively.

Figure 5A:
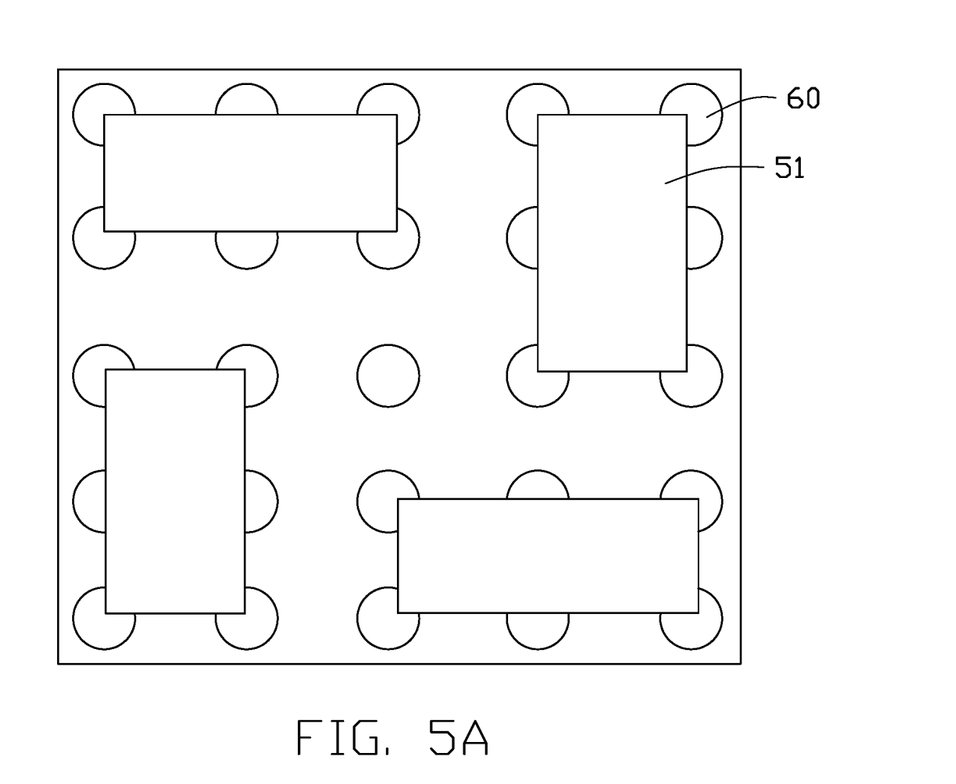
FIG. 5A is a top view of the contact holes of FIG. 4 in one embodiment.
Figure 5B:
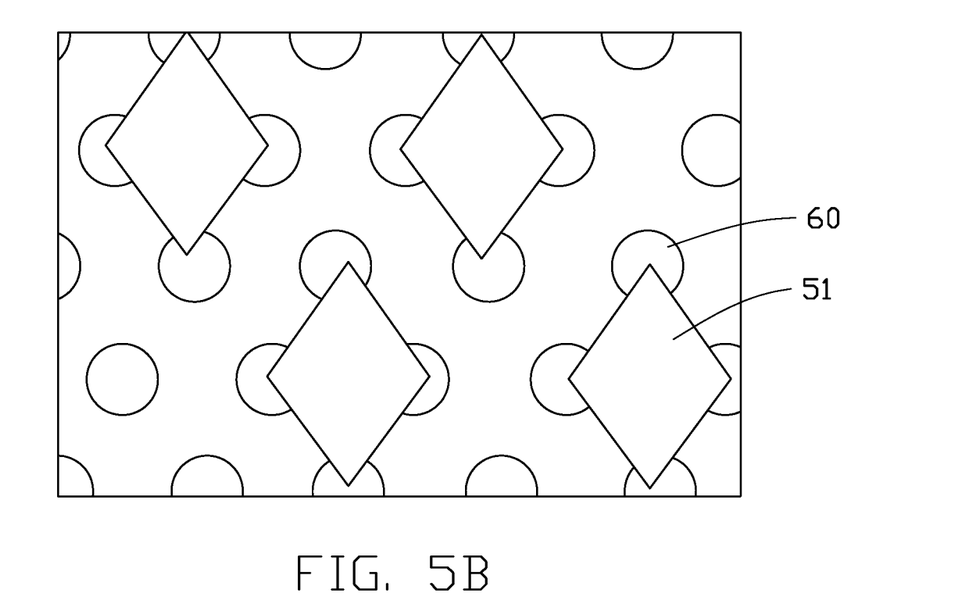
FIG. 5B is a top view of the contact holes of FIG. 4 in another embodiment.

Furthermore, a shape of each of the first supporter pattern 31 and the second supporter pattern 51 may be set according to actual needs. For example, as shown in FIGS. 5A and 5B, the cross-sections of the first supporter pattern 31 and the second supporter pattern 51 may be rhombic or rectangular.

Figure 6:
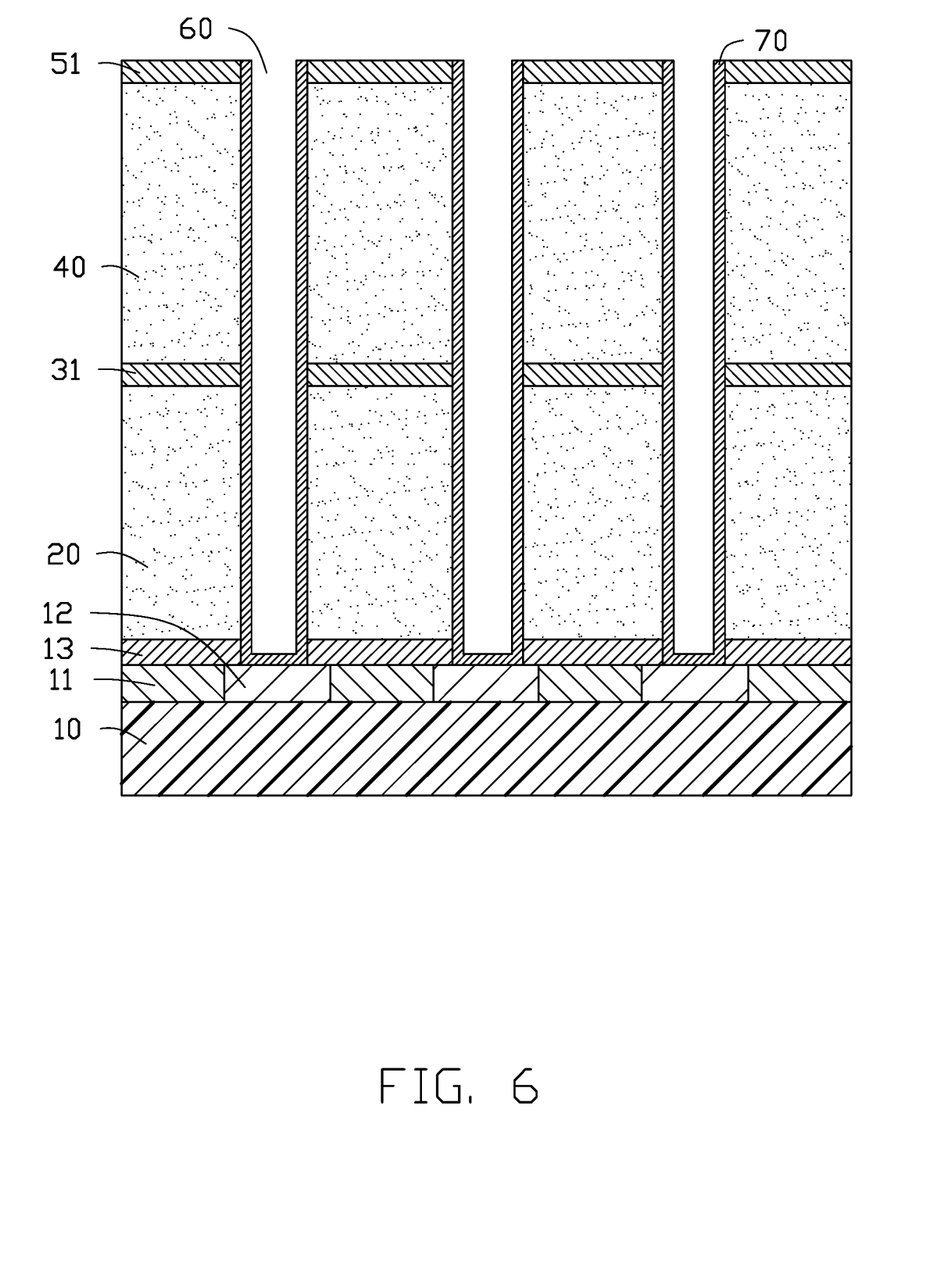
FIG. 6 is a schematic view showing a lower electrode formed on an inner surface of a contact hole of FIG. 4.

At step S4, referring to FIG. 6, a lower electrode 70 is formed on an inner surface of each contact hole 60, causing the first supporter pattern 31 and the second supporter pattern 51 to be positioned at a sidewall of the lower electrode 70.

As such, the first supporter pattern 31 and the second supporter pattern 51 support the lower electrode 70.

The lower electrode 70 has a substantially cylindrical structure, which has an opening facing upward.

Figure 7:
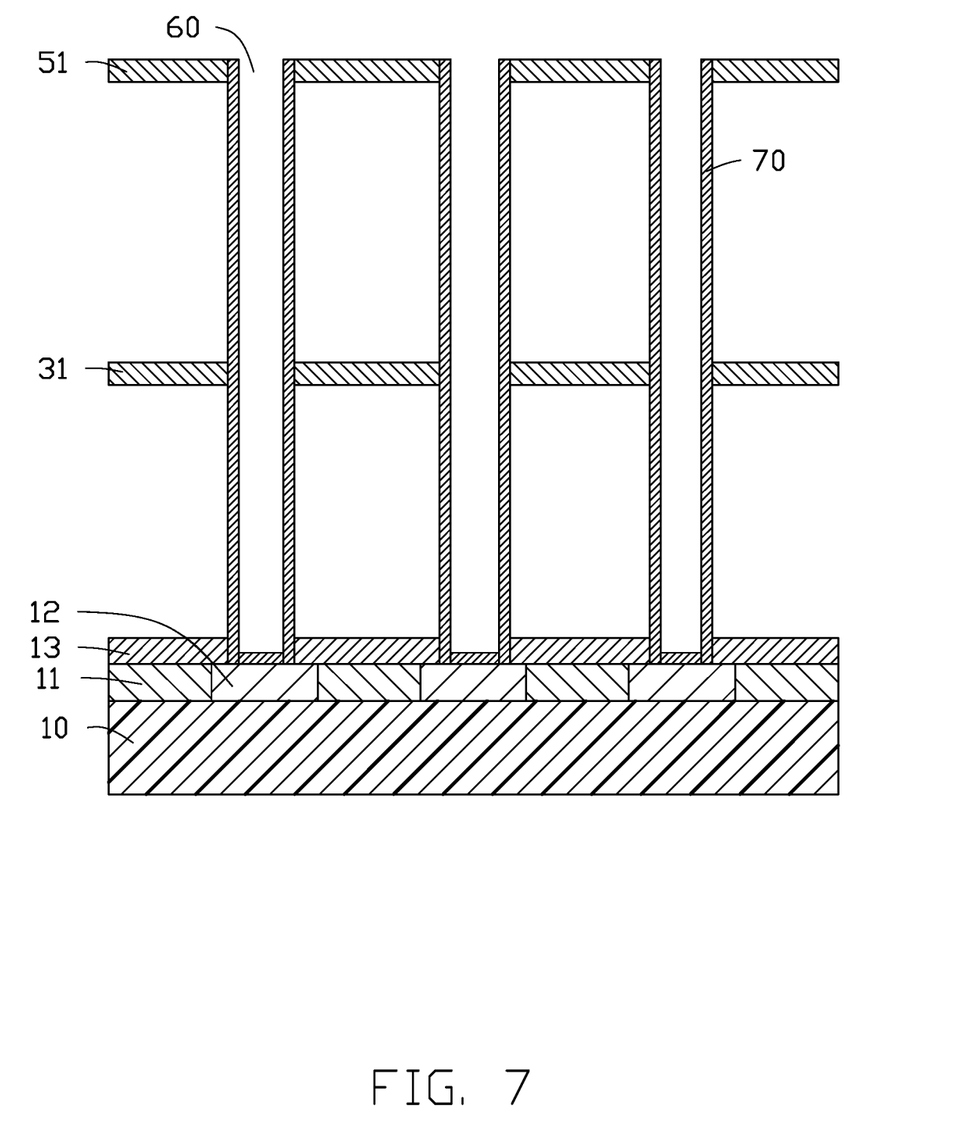
FIG. 7 is a schematic view showing the first mold layer and the second mold layer of FIG. 6 removed.

At step S5, referring to FIG. 7, the first mold layer 20 and the second mold layer 40 are removed. The first mold layer 20 and/or the second mold layer 40 being made of the dielectric material are removed by ashing.

The basic mechanism of the ashing process is to remove the dielectric material by ashing the dielectric material into CO and $CO_2$ through a combustion reaction caused by providing O radicals, $O_2$ radicals, and so forth, generated in plasma.

A conventional wet etching process is used to remove a first mold layer and a second mold layer. An isotropic etchant is applied in the wet etching process, thus when a height of the first mold layer or the second mold layer increases, portions of the first mold layer and/or the second mold layer disposed at the bottom are not completely etched. Thus, a lower electrode with a high aspect ratio is difficult to manufacture. In comparison, the first mold layer 20 and/or the second mold layer 40 are removed by ashing in the present disclosure, which completely removes the first mold layer 20 and/or the second mold layer 40. Therefore, the lower electrode 70 with a higher aspect ratio can be formed.

In the embodiment, when the second mold layer 40 is made of the dielectric material, the second mold layer 40 is removed by ashing. The first mold layer 20 is removed by wet etching.

When the first mold layer 20 is made of the dielectric material, the first mold layer 20 is removed by ashing. The second mold layer 40 is removed by wet etching.

When both the first mold layer 20 and the second mold layer 40 are made of the dielectric material, both the first mold layer 20 and the second mold layer 40 are removed by ashing.

The wet etching may use a mixed solution, including hydrogen fluoride, an organic solvent, a surfactant, and deionized water, as an etchant. The organic solvent may be ethanol, tricarboxylic acid, ketone, ether, and ester. In the embodiment, the mixed solution may include the hydrogen fluoride of 0.01% to 10% by weight, the surfactant of 0.0001% to 2% by weight, the deionized water of 0.01% to 10% by weight, and the organic solvent of a remaining amount. The wet etching may be performed at a temperature of 10 degrees Celsius to 100 degrees Celsius in a batch device or a rotary device.

Furthermore, the first supporter layer 30 and the second supporter layer 50 are removed by dry etching or wet etching.

In the embodiment, after removing the first mold layer 20 and the second mold layer 40 in step S5, the method further includes following steps.

Figure 8:
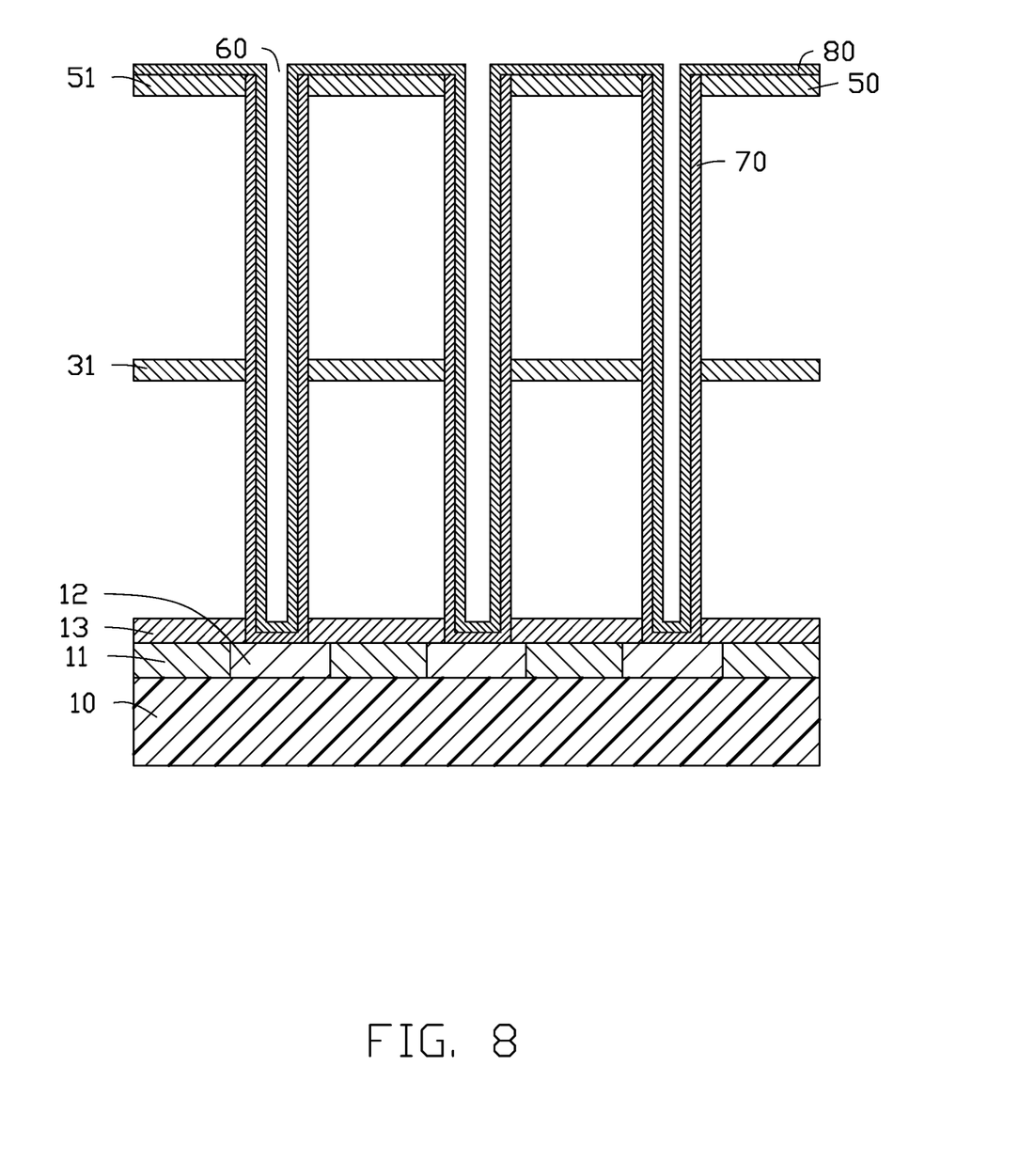
FIG. 8 is a schematic view showing a dielectric layer formed on the lower electrode of FIG. 7.

At step S6, referring to FIG. 8, a dielectric layer 80 is formed on the lower electrode 70 having the first supporter pattern 31 and the second supporter pattern 51.

In the embodiment, the dielectric layer 80 may be formed by chemical vapor deposition or atomic layer deposition. The dielectric layer 80 is made of a dielectric material with a high dielectric constant. For example, the dielectric layer 80 may be made of at least one of hafnium dioxide and alumina.

Figure 9:
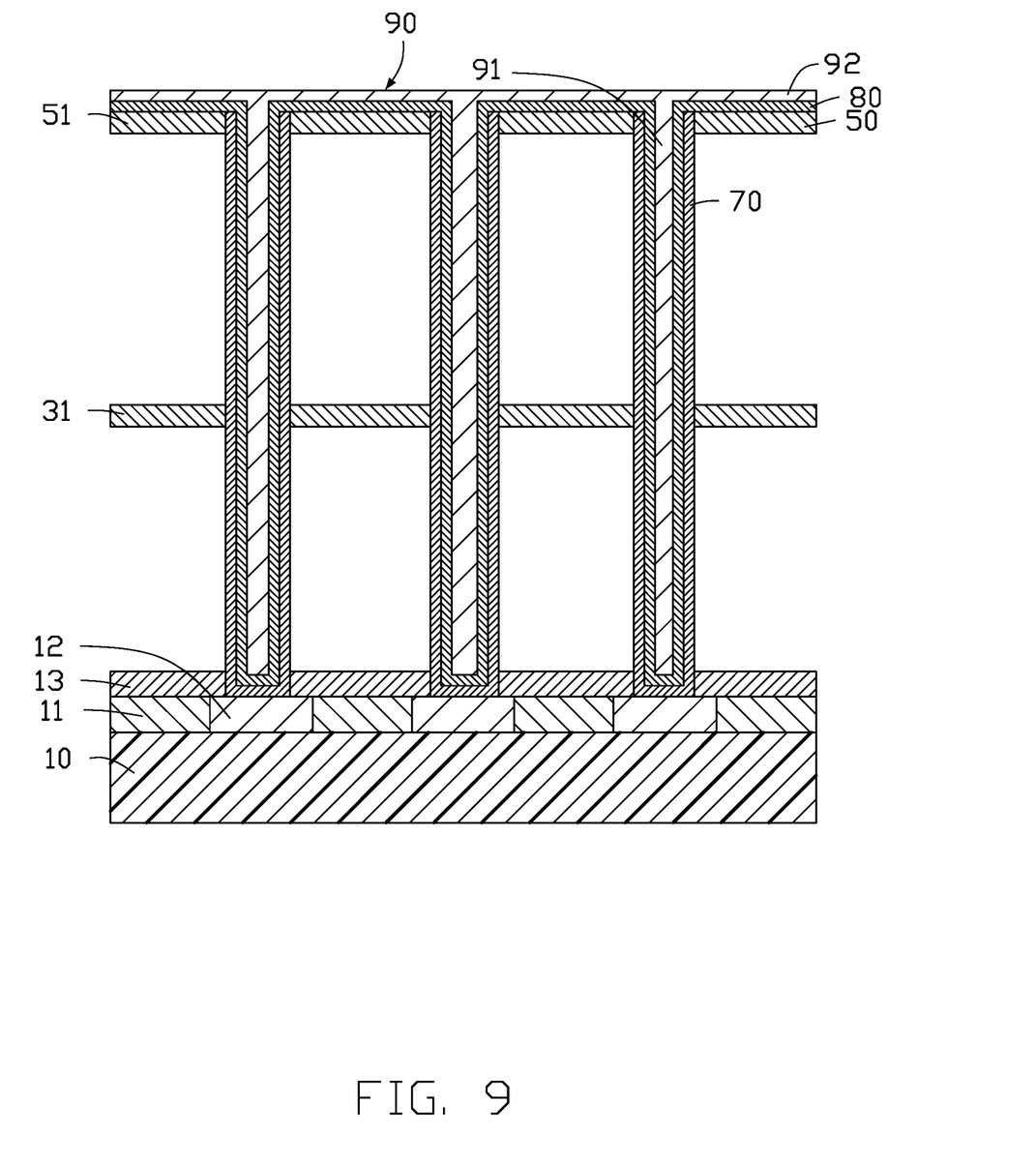
FIG. 9 is a schematic view of the capacitor after forming an upper electrode on the dielectric layer of FIG. 8.

At step S7, referring to FIG. 9, an upper electrode 90 is formed on the dielectric layer 80 to obtain a capacitor 100.

The upper electrode 90 is made of at least one of titanium nitride, tungsten nitride, tantalum nitride, copper, aluminum, and tungsten. The upper electrode 90 may be formed by chemical vapor deposition, atomic layer deposition, or metal organic chemistry vapor deposition.

The upper electrode 90 includes a first portion 91 and a second portion 92 connected to the first portion 91. The first portion 91 of the upper electrode 90 is formed on the dielectric layer 80, and is disposed in the lower electrode 70. The first portion 91 has a substantially cylindrical structure, which has an opening facing upward. The second portion 92 of the upper electrode 90 is formed in other regions on the dielectric layer 80, that is, the second portion 92 is disposed on the top of the lower electrode 70 and on the second supporter pattern 51.

The present disclosure further provides another embodiment of a method for manufacturing a capacitor. The difference from the above first embodiment, is that at least one supporter layer (not shown) may be further formed on the second supporter layer 50 at step S2. Two adjacent supporter layers are separated by a mold layer. For example, a third mold layer and a third supporter layer are further formed on the second supporter layer 50 in that order. In another example, a third mold layer, a third supporter layer, a fourth mold layer, and a fourth supporter layer may be formed on the second supporter layer 50 in that order. Therefore, the height of the lower electrode 70 can be increased, thereby increasing the capacitance of the capacitor 100. The third mold layer and/or the fourth mold layer may also include the dielectric material.

FIG. 8 illustrates the capacitor 100 made by the above method. The capacitor 100 includes the substrate 10 and the lower electrode 70 disposed on the substrate 10. The first supporter pattern 31 and the second supporter pattern 51 are disposed on a side wall of the lower electrode 70, and are spaced from each other. The first supporter pattern 31 is disposed between the second supporter pattern 51 and the substrate 10.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a capacitor, the method comprising:
   providing a substrate;
   forming a first mold layer, a first supporter layer, a second mold layer, and a second supporter layer on the substrate in that order, wherein at least one of the first mold layer and the second mold layer are made of a dielectric material having a low dielectric constant or a super low dielectric constant;
   defining at least one contact hole passing through the second supporter layer, the second mold layer, the first supporter layer, and the first mold layer, wherein the first supporter layer and the second supporter layer having the at least one contact hole form a first supporter pattern and a second supporter pattern, respectively;

forming a lower electrode on an inner surface of the at least one contact hole, causing the first supporter pattern and the second supporter pattern to be positioned at a sidewall of the lower electrode; and removing the first mold layer and the second mold layer, wherein the first mold layer and/or the second mold layer being made of the dielectric material are removed by ashing.

2. The method of claim 1, wherein the dielectric constant is in a range of 2.0 to 3.0.

3. The method of claim 2, wherein the dielectric material is a polymer of atom transfer radical polymerization or octamethylcyclotetrasiloxane.

4. The method of claim 1, wherein the first mold layer is made of boro-phospho-silicate glass, fluosilicate glass, phosphosilicate glass, and any combination thereof, and the second mold layer is made of the dielectric material.

5. The method of claim 4, wherein the second mold layer is removed by ashing.

6. The method of claim 1, wherein the first mold layer is made of the dielectric material, and the second mold layer is made of silica.

7. The method of claim 6, wherein the first mold layer is removed by ashing.

8. The method of claim 1, wherein both the first mold layer and the second mold layer are made of the dielectric material.

9. The method of claim 8, wherein both the first mold layer and the second mold layer are removed by ashing.

10. The method of claim 1, wherein after removing the first mold layer and the second mold layer, the method further comprises:

forming a dielectric layer on the lower electrode having the first supporter pattern and the second supporter pattern; and forming an upper electrode on the dielectric layer.

11. The method of claim 10, wherein the dielectric layer is made of hafnium dioxide, aluminum oxide, and any combination thereof.

12. The method of claim 10, wherein the upper electrode is made of titanium nitride, tungsten nitride, tantalum nitride, copper, aluminum, tungsten, and any combination thereof.

13. The method of claim 1, wherein the first supporter layer and the second supporter layer are made of silicon nitride.

14. The method of claim 13, wherein the first supporter layer and the second supporter layer are removed by dry etching or wet etching.

15. The method of claim 1, wherein the substrate comprises at least one doped region, before forming the first mold layer, the first supporter layer, the second mold layer, and the second supporter layer, the method further comprises:

forming an insulating layer, wherein the insulating layer comprises at least one contact plug passing through the insulating layer, and the at least one contact plug is in contact with one of the at least one doped region.

16. The method of claim 1, wherein the substrate is made of monocrystalline silicon or silicon-on-insulator.

* * * * *